(12) United States Patent
Suganuma et al.

(10) Patent No.: US 11,454,601 B2
(45) Date of Patent: Sep. 27, 2022

(54) SUBSTRATE EVALUATION CHIP AND SUBSTRATE EVALUATION DEVICE

(71) Applicants: OSAKA UNIVERSITY, Suita (JP); YAMATO SCIENTIFIC CO., LTD., Tokyo (JP)

(72) Inventors: Katsuaki Suganuma, Suita (JP); Shijo Nagao, Suita (JP); Akio Shimoyama, Suita (JP); Dongjin Kim, Suita (JP); Kazutaka Takeshita, Tokyo (JP); Naoki Wakasugi, Tokyo (JP)

(73) Assignees: OSAKA UNIVERSITY, Suita (JP); YAMATO SCIENTIFIC CO., LTD., Tokyo (JP)

( * ) Notice: Subject to any disclaimer, the term of this patent is extended or adjusted under 35 U.S.C. 154(b) by 8 days.

(21) Appl. No.: 16/998,395

(22) Filed: Aug. 20, 2020

(65) Prior Publication Data
US 2020/0378912 A1 Dec. 3, 2020

Related U.S. Application Data

(63) Continuation of application No. PCT/JP2019/006438, filed on Feb. 21, 2019.

(30) Foreign Application Priority Data

Feb. 22, 2018 (JP) .............................. JP2018-029795

(51) Int. Cl.
*G01N 25/18* (2006.01)
*H01L 23/373* (2006.01)
*H01L 23/00* (2006.01)

(52) U.S. Cl.
CPC .......... *G01N 25/18* (2013.01); *H01L 23/3735* (2013.01); *H01L 24/32* (2013.01);
(Continued)

(58) Field of Classification Search
USPC .......................................... 374/43, 208, 141
See application file for complete search history.

(56) References Cited

U.S. PATENT DOCUMENTS 7,332,918 B2 * 2/2008 Sugiyama .......... G01R 31/2865
324/750.03
7,656,627 B2 * 2/2010 Ker ..................... H01L 27/0266
361/56

(Continued)

FOREIGN PATENT DOCUMENTS

CN 1544954 A 11/2004
JP 05-152303 A 6/1993
(Continued)

OTHER PUBLICATIONS

"Test Methods for Electronic Circuit Board for High-Brightness LEDs", JPCA-TMC-LED02T-2010, May 2010, first edition first printing issued, 54 pages.

(Continued)

*Primary Examiner* — Mirellys Jagan
(74) *Attorney, Agent, or Firm* — Sughrue Mion, PLLC

(57) ABSTRACT

A substrate evaluation chip is used to perform a test for evaluating a thermal characteristic of a mounting substrate that is mountable a power semiconductor. The substrate evaluation chip includes an insulating substrate bonded with the mounting substrate, and a heating pattern that is formed on a surface of the insulating substrate by a metallic film and is arranged by having a predetermined shape that is optimized to beat the insulating substrate more uniformly. The insulating substrate is a substrate in which an insulating film is formed on a surface of a single crystal substrate having a thermal conductivity of 250 [W/mK] or more.

9 Claims, 12 Drawing Sheets

(52) U.S. Cl.
CPC .............. *H01L 24/48* (2013.01); *H01L 24/73* (2013.01); *H01L 2224/32225* (2013.01); *H01L 2224/48225* (2013.01); *H01L 2224/73265* (2013.01)

(56) References Cited

U.S. PATENT DOCUMENTS

| | | | | |
|---|---|---|---|---|
| 8,931,950 | B2* | 1/2015 | King | G01N 25/4813 |
| | | | | 422/51 |
| 8,974,116 | B2* | 3/2015 | Okamoto | G01K 1/14 |
| | | | | 374/29 |
| 2002/0024349 | A1* | 2/2002 | Hirayama | G01N 25/486 |
| | | | | 324/762.01 |
| 2005/0058178 | A1* | 3/2005 | Shih | G01N 3/18 |
| | | | | 374/51 |
| 2008/0259607 | A1* | 10/2008 | Shimada | F21V 23/06 |
| | | | | 362/276 |
| 2009/0144971 | A1* | 6/2009 | Takekoshi | G01R 1/06722 |
| | | | | 29/846 |
| 2009/0312954 | A1* | 12/2009 | Utriainen | G01N 27/128 |
| | | | | 702/23 |
| 2011/0234251 | A1 | 9/2011 | Komatsu et al. | |
| 2012/0068728 | A1* | 3/2012 | Kataoka | G01R 31/3025 |
| | | | | 324/756.03 |
| 2016/0108552 | A1* | 4/2016 | Kuraoka | H01L 21/0262 |
| | | | | 117/97 |
| 2019/0002281 | A1* | 1/2019 | Yumoto | C23C 26/00 |
| 2020/0064287 | A1* | 2/2020 | Mori | G01N 25/18 |

FOREIGN PATENT DOCUMENTS

| | | |
|---|---|---|
| JP | 09-55460 A | 2/1997 |
| JP | 2001-141680 A | 5/2001 |
| JP | 2005-005528 A | 1/2005 |
| JP | 2008-304447 A | 12/2008 |
| JP | 2012-184990 A | 9/2012 |
| JP | 2017-173030 A | 9/2017 |
| WO | 2010/064487 A1 | 6/2010 |

OTHER PUBLICATIONS

International Search Report for PCT/JP2019/006438, dated May 14, 2019.

Extended European Search Report dated Oct. 25, 2021 in European Application No. 19757737.2.

* cited by examiner

46

(UPPER SURFACE)

(LOWER SURFACE)

46B (UPPER SURFACE)

(LOWER SURFACE)

SUBSTRATE EVALUATION CHIP AND SUBSTRATE EVALUATION DEVICE

CROSS-REFERENCE TO RELATED APPLICATIONS

The present application is a continuation of International Application No. PCT/JP2019/006438, filed on Feb. 21, 2019, and based upon and claims the benefit of priority from Japanese Patent Application No. 2018-029795, filed on Feb. 22, 2018, the entire contents of which are incorporated herein by reference.

TECHNICAL FIELD

The present disclosure relates to a substrate evaluation chip and a substrate evaluation device used for evaluating a thermal resistance characteristic and the like of a ceramic wiring board that can mount, for example, a next-generation wide band gap (WBG) power semiconductor.

BACKGROUND

As a method for evaluating a thermal resistance characteristic and the like of an insulating ceramic wiring board that can mount a power semiconductor, a steady-state thermal resistance measurement method (also called as a JPCA (Japan Electronics Packaging and Circuits Association) method) is known (see Test Methods for Electronic Circuit Board for High-Brightness LEDs; JPCA-TMC-LED02T-2010; May 2010, first edition first printing issued). The steady-state thermal resistance measurement method is a standardized test method for measuring a thermal resistance of an electronic circuit board for a high-brightness LED (Light Emitting Diode).

SUMMARY

By the way, in a power semiconductor such as a high-brightness LED, adoption of insulating substrates which are excellent in heat resistance such as SiC, GaN, and $Ga_2O_3$ has been studied, and for the formation of power modules mounted with the power semiconductors, mounting substrates excellent in heat resistance and heat radiation become essential.

As representative mounting boards for mounting power semiconductors, insulating ceramic wiring boards such as a DBC (Direct Bonded Copper) board, a DBA (Direct Bonded Aluminum) board, and an AMB (Active Metal Bonding) board are known.

Ceramic wiring boards made of alumina ($Al_2O_3$) as ceramics have been prevailing, but, attentions are drawn to aluminum nitride (AlN) having higher thermal conductivity and silicon nitride ($Si_3N_4$) having high toughness.

Such a ceramic wiring board has thermal resistance at a bonded interface and is affected by thermal expansion or stress caused by change in a temperature, and thus, an evaluation of thermal characteristics in an entire substrate becomes important. Particularly, establishment of a standard method for precisely evaluating thermal characteristics in a state close to a power module mounted with a power semiconductor was urgently demanded.

The present disclosure is made in view of the above, and an object of the present disclosure is to provide a substrate evaluation chip and a substrate evaluation device that causes a substrate evaluation chip to generate heat as uniformly as possible and also can measure a rise temperature of a mounting substrate more precisely, can evaluate a thermal characteristic of a mounting substrate with high precision, and enables the standardization of evaluation easily.

To solve the above problem, a first embodiment of the present disclosure provides a substrate evaluation chip used to perform a test for evaluating a thermal characteristic of amounting substrate that is mountable a power semiconductor, and the substrate evaluation chip includes: an insulating substrate bonded with the mounting substrate; and a heating pattern that is formed on a surface of the insulating substrate by a metallic film and is arranged by having a predetermined shape that is optimized to heat the insulating substrate more uniformly. The insulating substrate is a substrate in which an insulating film is formed on a surface of a single crystal substrate having a thermal conductivity of 250 [W/mK] or more.

According to the first embodiment of the present disclosure, while imitating a next-generation power semiconductor, it is possible to realize a substrate evaluation chip specialized in heat generation control and temperature measurement. That is, the rise temperature of the insulating substrate can be measured more precisely because it becomes possible to cause a substrate evaluation chip to generate heat in a substantially uniform manner by the heating pattern. Accordingly, irrespective on an actual power module, the thermal characteristics of the mounting substrate can be evaluated with high precision and a standard method of evaluation can be easily established.

A second embodiment of the present disclosure provides a substrate evaluation device used to perform a test for evaluating a thermal characteristic of a mounting substrate that is mountable a power semiconductor in a state in which a substrate evaluation chip is mounted on a surface of the mounting substrate, and the substrate evaluation device includes: the substrate evaluation chip including an insulating substrate bonded with the mounting substrate, a heating pattern that is formed on a surface of the insulating substrate by a metallic film and is arranged by having a predetermined shape that is optimized to heat the insulating substrate more uniformly, and a temperature measurement pattern that is formed on the surface of the insulating substrate by a metallic film and is configured to measure a temperature of the insulating substrate heated by the heating pattern; the mounting substrate including a chip bonding pattern bonded with the substrate evaluation chip and a plurality of pad bonding patterns connected with each electrode pad of the heating pattern and each electrode pad of the temperature measurement pattern; a cooling unit configured to cool the mounting substrate; a load application unit including a plurality of terminal electrodes for pressing the mounting substrate against the cooling unit via the plurality of pad bonding patterns; a heating unit configured to raise a temperature of the insulating substrate of the substrate evaluation chip by heating the heating pattern of the substrate evaluation chip via any terminal electrodes of the plurality of terminal electrodes; and a measuring unit configured to measure the temperature of the insulating substrate by the temperature measurement pattern of the substrate evaluation chip via any terminal electrodes of the plurality of terminal electrodes, wherein the thermal characteristic of the mounting substrate is evaluated based on a measurement result of the measuring unit.

According to the second embodiment of the present disclosure, in a state in which the substrate evaluation chip is mounted on the surface of the mounting substrate that is mountable a power semiconductor, the mounting substrate is pressed against the cooling unit whose temperature is controlled to be a constant temperature by the load application unit to be cooled, and at the same time, the heating pattern is caused to generate heat with high precision by the heating unit, and accordingly, it becomes possible to cause the mounting substrate to generate heat indirectly. For this reason, by obtaining a steady thermal resistance value from steady power for causing the heating pattern to generate heat and the rise temperature of the substrate evaluation chip, the thermal characteristics of the mounting substrate can be evaluated with high precision.

According to the first and second embodiments of the present disclosure, it is possible to provide the substrate evaluation chip and the substrate evaluation device that causes the substrate evaluation chip to generate heat as uniformly as possible and at the same time can measure a rise temperature of the mounting substrate more precisely, can evaluate a thermal characteristic of the mounting substrate with high precision and enables the standardization of evaluation easily.

BRIEF DESCRIPTION OF TIE DRAWINGS

FIGS. 7A and 78 are pattern diagrams illustrating one example of the pseudo heat generating chip illustrated in FIG. 5.

Figure 11:
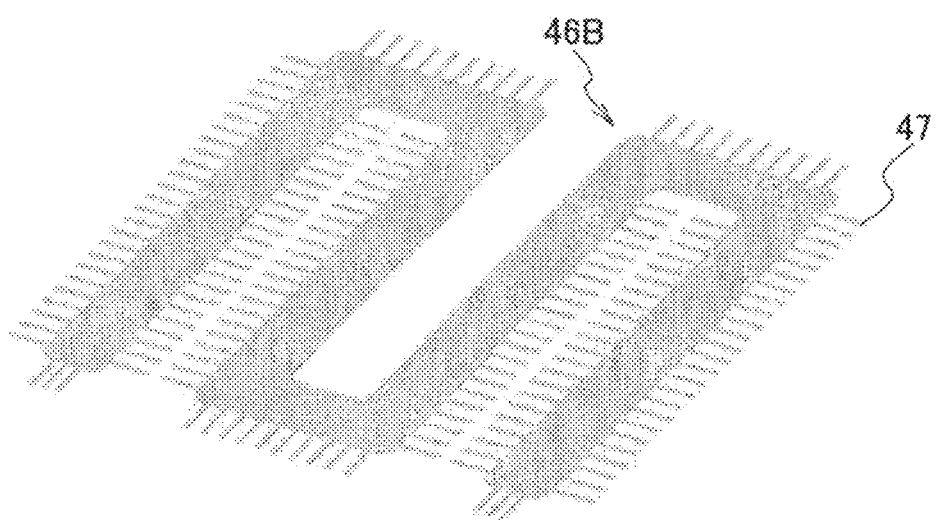
FIG. 11 is a schematic diagram illustrating an example of a constitution of a fin-attached heating pattern.
Figure 12A:
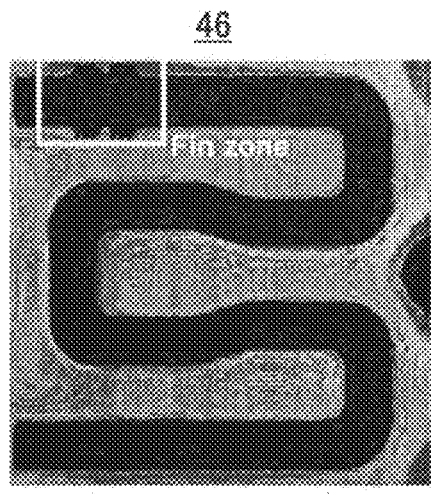
Figure 12A:
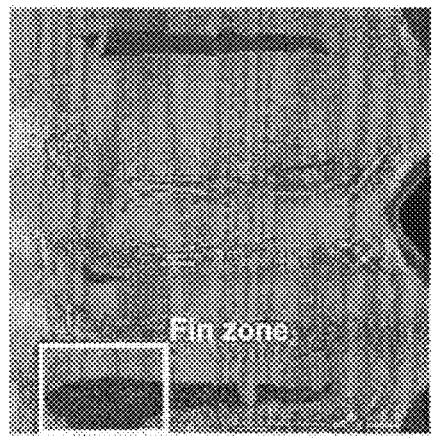
Figure 12B:
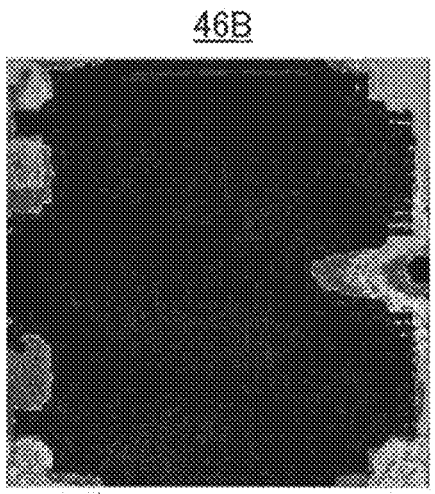
Figure 12B:
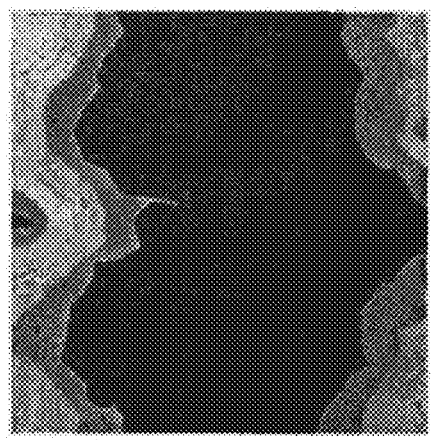

FIG. 12A is a temperature distribution diagram illustrating an upper surface side and a lower surface side of the pseudo heat generating chip arranged with a heating pattern according to the embodiment and FIG. 12B is a temperature distribution diagram illustrating an upper surface side and a lower surface side of a pseudo heat generating chip arranged with the fin-attached heating pattern of FIG. 11.

DESCRIPTION OF EMBODIMENTS

An embodiment is described below with reference to accompanying drawings.

(Constitution of Substrate Evaluation Device 1)

Figure 1A:
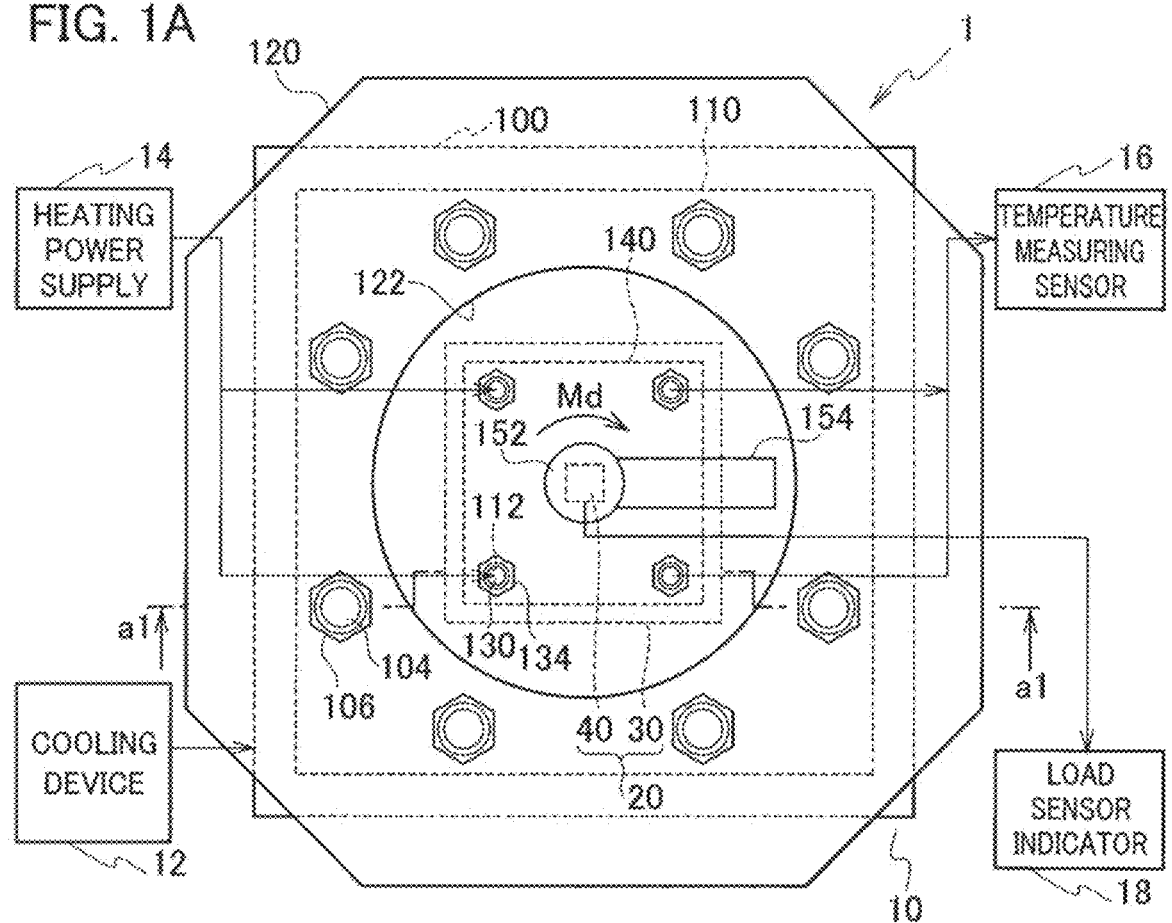
FIG. 1A is a schematic plan view illustrating an example of a constitution of a substrate evaluation device according to an embodiment and FIG. 1B is a schematic cross sectional view taken along a line a1-a1 of FIG. 1A.
Figure 1B:
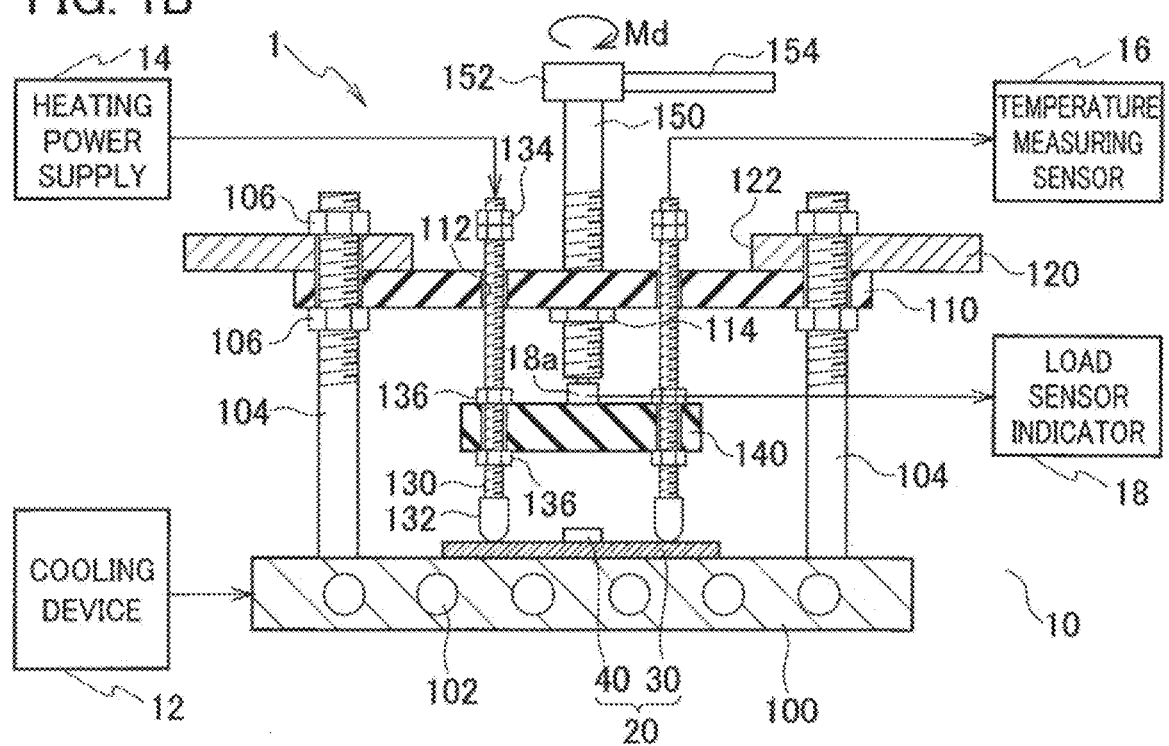

FIG. 1A is a schematic plan view illustrating an example of a constitution of a substrate evaluation device 1 according to an embodiment and FIG. 1B is a schematic cross sectional view taken along a line a1-a1 of FIG. 1A.

The substrate evaluation device 1 according to the embodiment is used for performing a test for pseudo-evaluating thermal characteristics of a mounting board on which a next-generation WBG power semiconductor can be mounted such as, for example, an electronic circuit board for high-brightness LEDs by using an evaluation sample 20 in which a substrate evaluation chip 40 is mounted on a surface of a mounting substrate 30. The substrate evaluation device 1 includes a load control unit (a sample holder) 10 as a load application unit, a cooling device 12, a heating power supply 14 as a heating unit, and a temperature measuring sensor 16 as a measuring unit. The details of the evaluation sample 20 will be described later.

The load control unit 10 includes, for example, a water-cooled heat sink (a cooling unit) 100 for cooling the evaluation sample 20. The heat sink 100 is a cold plate having a circulation path 102 in which a refrigerant (cooling water) whose temperature is controlled to be a predetermined temperature by the cooling device 12 circulates. As the cooling device 12, used is a cooling device with sufficient cooling capacity (for example, 250 [W], 5.4 [L/min]) for a heat generation amount of the evaluation sample 20 which will be described later.

In the heat sink 100, a plurality of support columns 104 (in the embodiment, eight support columns) are arranged at substantially equal intervals so as to surround the periphery of the evaluation sample 20. An insulating (for example, acrylic) support plate 110 is supported by the eight support columns 104 at above the evaluation sample 20. The support plate 110 is fixed to each support column 104 by using a nut 106, respectively.

A metal plate (rigid body) 120 may be provided above the support plate 110. The metal plate 120 has an opening 122 for avoiding the interference of electrode rods (terminal electrodes) 130 and a threaded shaft 150 for controlling load and is fixed to each support column 104 by using the nut 106, respectively. The metal plate 120 is used for suppressing the deformation (curvedness) of the support plate 110, which deformation is caused by the stress at the time of applying a load to a supporting rigid body 140 by means of the threaded shaft 150, and if the support plate 110 has the sufficient rigidity, the metal plate 120 can be omitted.

The support plate 110 has a nut 114 which is embedded in the vicinity of the center of thereof and is arranged to support the threaded shaft 150 via the nut 114. That is, the threaded shaft 150 is supported by the support plate 110 such that the threaded shaft 150 moves vertically while rotating relative to the support plate 110.

A load sensor element 18a as a load detection unit is attached to a lower end portion on a tip side of the threaded shaft 150. Further, an insulating (for example, acrylic) supporting rigid body 140 as a support member is attached to the threaded shaft 150 via the load sensor element 18a. Still further, a plurality of electrode rods 130 (in the embodiment, four electrode rods) are commonly supported by and fixed to the supporting rigid body 140.

The load sensor element 18a is, for example, an ultra-compact compression type load cell. The load sensor element 18a is connected to a load sensor indicator 18 (for example, a high-speed peak hold compatible digital indicator) that is a load cell indicator.

An operation handle 154 to be operated by an operator is attached to an upper end portion on a rear end side of the threaded shaft 150 via an attaching portion 152. That is, a load in accordance with an operation of the operation handle 154 is applied to the supporting rigid body 140 by the operator operating the operation handle 154 to cause the threaded shaft 150 to be pivoted in a direction of an arrow Md illustrated in FIG. 1B. The load applied to the supporting rigid body 140 is sensed by the load sensor element 18a and is digitally displayed by the load sensor indicator 18 so that the operator can see it.

Each electrode rod 130 is individually fixed to the supporting rigid body 140 by using nuts 136 with being, for example, passed through the supporting rigid body 140. Further, a rear end side of each electrode rod 130 is inserted in a through-hole 112 of the support plate 110. A double nut 134 is attached to the vicinity of the upper end portion on the rear end side of each electrode rod 130 at above the support plate 110 to restrict a downward movement (load) of each electrode rod 130.

Attached to the lower end portion on the tip side of each electrode rod 130 is a hemispherical contact portion 132 as a contact surface that is a contact portion with the evaluation sample 20.

In connection with the application of the load to the supporting rigid body 140 by the threaded shaft 150, a rear surface side of the evaluation sample 20 is pressed against an upper surface of the heat sink 100 by the contact portion 132 provided to each electrode rod 130. At that time, each contact portion 132 is set to have a hemispherical curved surface, and thus, a contact area between a plain surface of the evaluation sample 20 and the contact portion 132 is minimum.

In the embodiment, for example, the four electrode rods 130 are terminal electrodes for pressing the evaluation sample 20 against the heat sink 100 for cooling the evaluation sample 20, and also, while two of the four electrode rods 130 are connected to the heating power supply 14, the remaining two of the four electrode rods 130 are connected to the temperature measuring sensor 16.

That is, while pressing the evaluation sample 20 against the heat sink 100 by the four electrode rods 130, steady electric power Q for heating is supplied (energized) to the evaluation sample 20 by the two electrode rods 130 connected to the heating power supply 14 and a rise temperature of the evaluation sample 20 is measured by the two electrode rods 130 (also referred to as temperature measuring probes) connected to the temperature measuring sensor 16.

Figure 2:
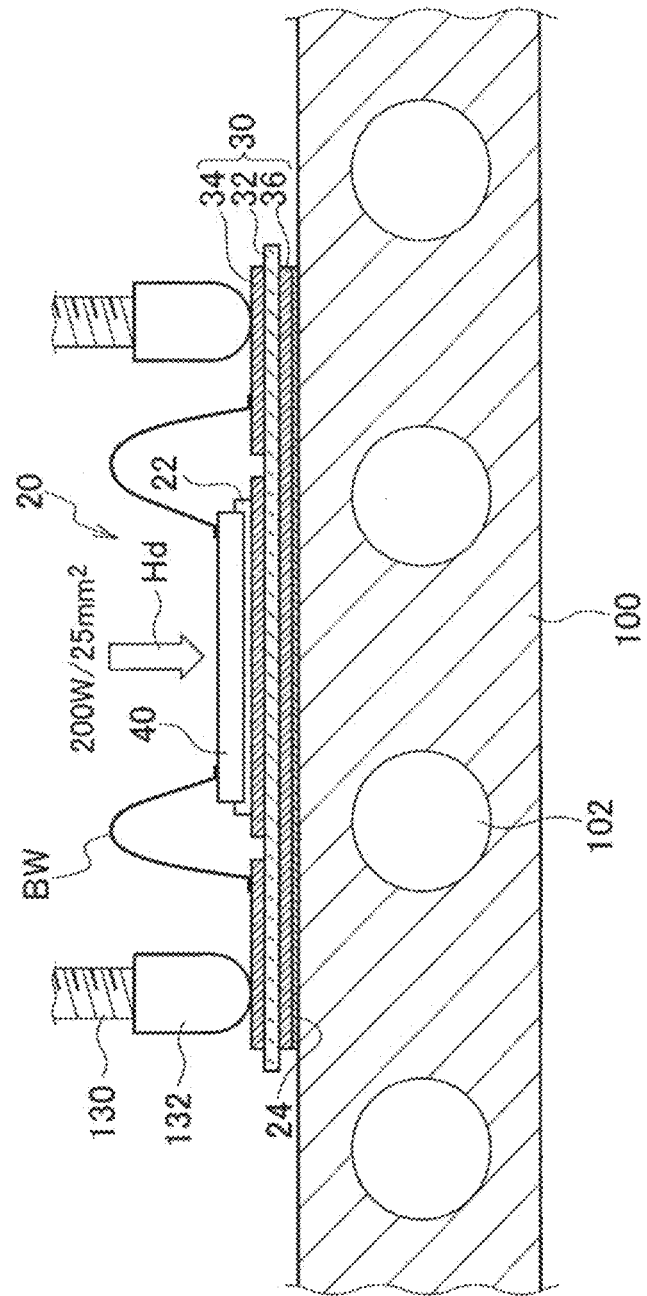
FIG. 2 is an enlarged view of a main part of a measurement system of the substrate evaluation device illustrated in FIG. 1B.

FIG. 2 is an enlarged view of a main part of a measurement system of the substrate evaluation device 1 illustrated in FIG. 1B.

A as illustrated in FIG. 2, the rear surface side of the evaluation sample 20 (a back side electrode pattern 36 of a ceramic wiring board 30) is arranged on an upper surface of the heat sink 100 via, for example, a heat radiating grease 24. The heat radiating grease 24 is, for example, a nanodiamond grease that is used as TIM (Thermal Interface Material) to further reduce an interfacial thermal resistance (Rth) between the heat sink 100 and the evaluation sample 20.

Figure 3:
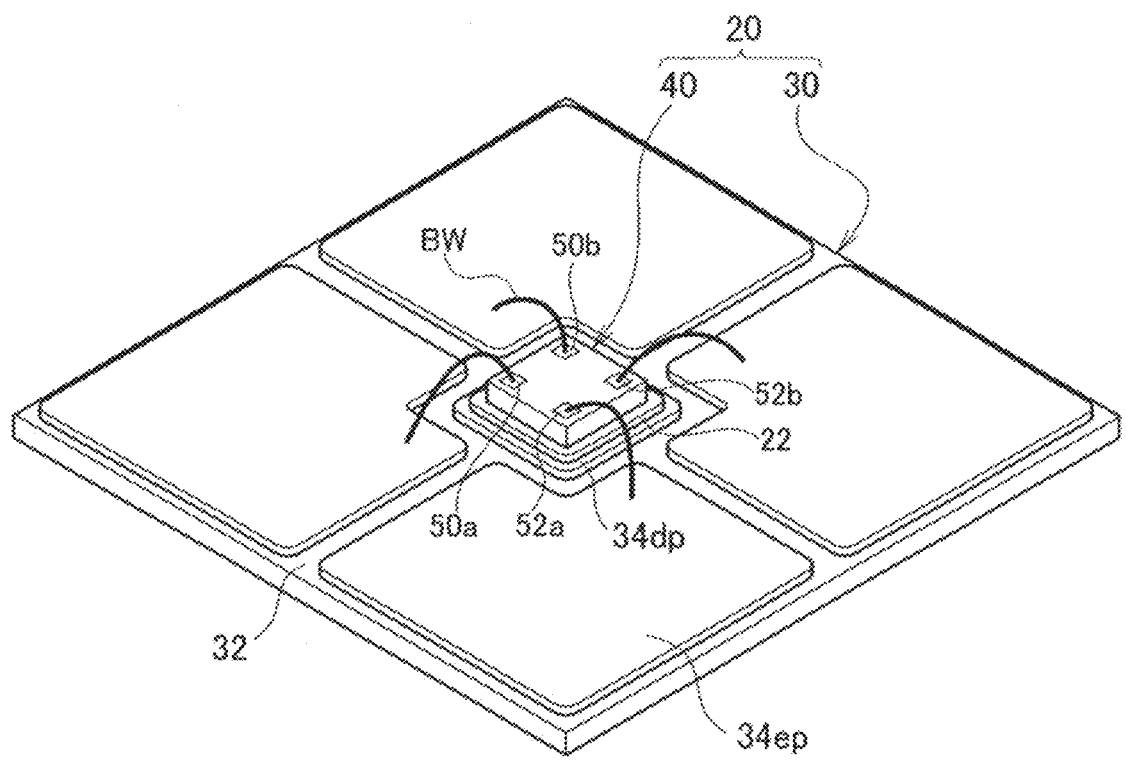
FIG. 3 is a perspective view of an evaluation sample used in the substrate evaluation device according to the embodiment.

As illustrated in FIGS. 2 and 3, the evaluation sample 20 includes the ceramic wiring board 30 as a mounting board, a pseudo heat generating chip (substrate evaluation chip) 40 that is mounted on a surface of the ceramic wiring board 30 via, for example, bonding silver paste 22, and bonding wires BW (gold wires or the like).

During an evaluation (test), the pseudo heat generating chip 40 is actually driven to be controlled as a TEG (Test Engineering Group) chip in a state in which the ceramic wiring board 30 of the evaluation sample 20 is pressed against the heat sink 100 by the contact portions 132 of the electrode rods 130 with a predetermined load. At that time, the pseudo heat generating chip 40 is driven to have heat generation density Hd of about, for example, 200 [W]/25 [mm$^2$](also referred to as a load heat generation amount, and is steady power Q [W] per unit area [mm$^2$]) by predetermined steady power Q (Q=1×V) supplied from the heating power supply 14.

A temperature of the heat sink 100 is controlled to be a predetermined temperature (for example, 25[° C.]) by the cooling device 12 during evaluation.

(Details of Evaluation Sample 20)

As illustrated in FIGS. 2 and 3, the evaluation sample 20 according to the embodiment includes the ceramic wiring board 30 and the pseudo heat generating chip 40 mounted on a surface of the ceramic wiring board 30.

In the evaluation sample 20, the ceramic wiring board 30 includes, for example, a ceramic thin plate 32 (hereinafter also referred to as a ceramic plate) that is a DBC (Direct Bonded Copper) substrate on which a next-generation WBG power semiconductor can be mounted, a front side electrode pattern 34 formed on one surface (front surface) of the ceramic plate 32, and a back side electrode pattern 36 formed on the other surface (rear surface) of the ceramic plate 32.

For the ceramic plate 32, $Si_3N_4$, AlN, $Al_2O_3$, or the like is used as a material for example.

The front side electrode pattern 34 includes a chip bonding pattern 34dp (also referred to as a die pad) formed of a copper thin film with which the pseudo heat generating chip 40 is bonded, and a pad bonding patterns 34ep, each of which is contacted with the contact portion 132 of each electrode rod 130 and is also bonded with the gold wires BW.

Figure 4A:
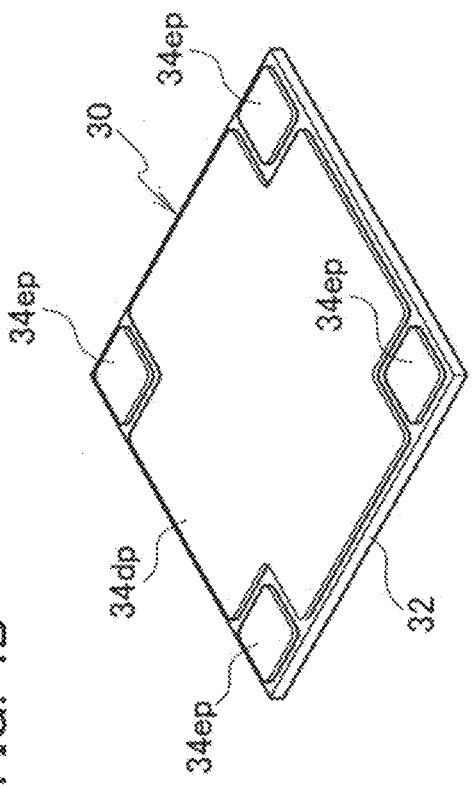
FIGS. 4A to 4D are perspective views each illustrating one example of a mounting substrate in an evaluation sample.

As the front side electrode pattern 34, as illustrated in, for example, FIG. 4A, a single chip bonding pattern 34dp may be arranged at the central portion of the ceramic plate 32 by having a substantially chip size, and each of four pad bonding patterns 34ep may be arranged at each corner portion of surrounding portions except for the central portion of the ceramic plate 32.

That is, as illustrated in, for example, FIG. 3, in the evaluation sample 20, the pseudo heat generating chip 40 is bonded on the chip bonding pattern 34dp via the bonding silver paste 22. Further, each pad bonding pattern 34ep is arranged to be connected to each of electrode portions (electrode pads) 50sa, 50b, 52a, 52b of the pseudo heat generating chip 40 via the gold wire BW and is also arranged to be contacted with a contact portion 132 of any of the electrode rods 130.

In the evaluation sample 20 according to the embodiment, a size of the ceramic wiring board 30 is set to be about 30 [mm] square and also a size of the pseudo heat generating chip 40 is set to be about 5 [mm] square. The thickness of pseudo heat generating chip 40 is about 0.33 [mm].

For the purpose of convenience, although the number of gold wires BW in each pattern is illustrated to be one, in order to enable withstanding against large current during heat generation, a plurality of (for example, ten) wires may be connected so that current is dispersed.

Further, in the evaluation sample 20 according to the embodiment, as illustrated in FIGS. 4A to 4D, a most suitable ceramic wiring board is adopted from among the plurality of ceramic wiring boards 30 that differ in a pattern shape (design) of the front side electrode pattern 34 by considering an influence of a heat flow path within the ceramic wiring board 30 that changes depending on the pattern shape of the front side electrode pattern 34.

Figure 4B:
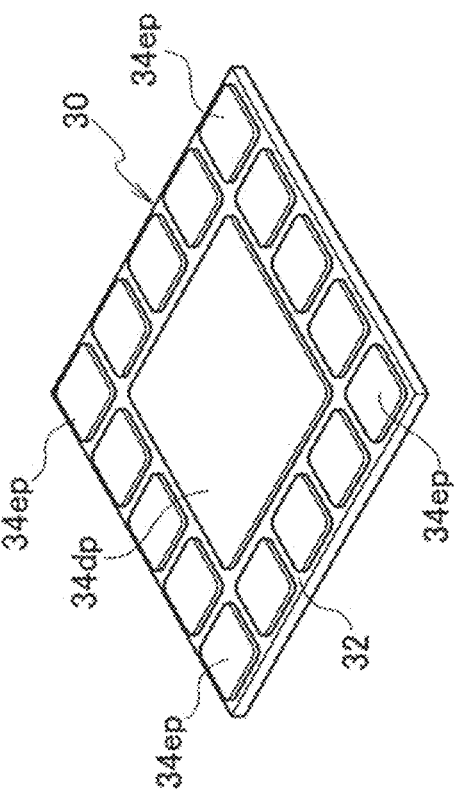

That is, by considering an influence of a heat flow path within the ceramic wiring board 30 that appears to be changed depending on the pattern shape of the front side electrode pattern 34, the front side electrode pattern 34 as illustrated in, for example, FIG. 4B may be adopted in which a single chip bonding pattern 34dp having a substantially equal size as the ceramic plate 32 is arranged at the central portion of the ceramic plate 32 in a "plus-shape" and the four pad bonding patterns 34ep are arranged at respective corner portions of surrounding portions except for the central portion.

Figure 4C:
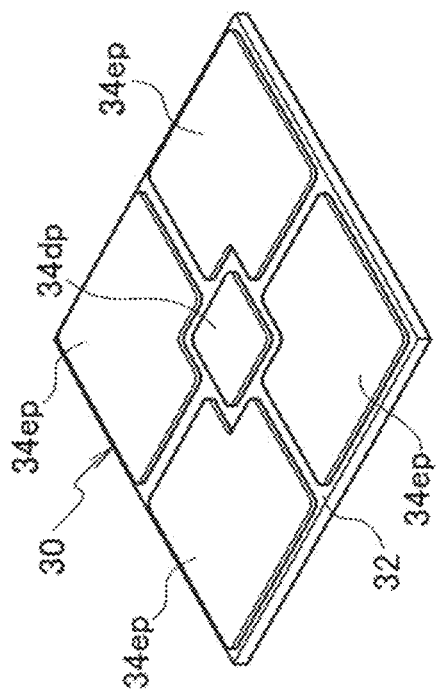
Figure 4D:
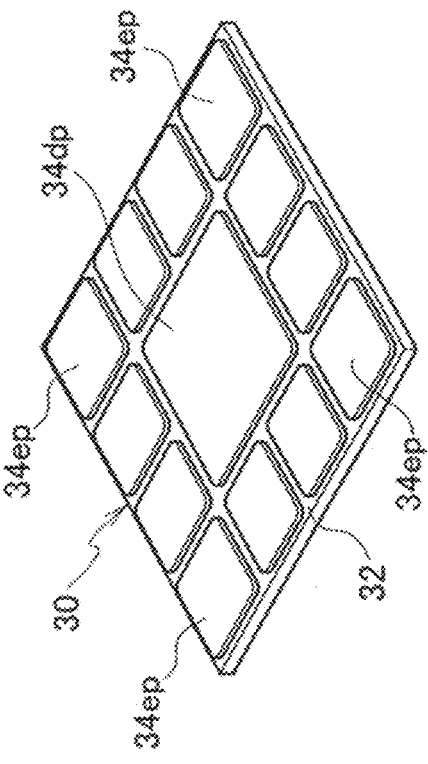

Further, the front side electrode pattern 34 as illustrated in FIGS. 4C and 4D may be adopted in which a single chip bonding pattern 34dp is arranged at the central portion of the ceramic plate 32 and a plurality of patterns including the four pad bonding patterns 34ep are arranged at portions surrounding the central portion.

In FIGS. 4A to 4D, the illustration of the back side electrode pattern 36 is omitted. Each of FIGS. 4A to 4D exemplifies a case where the number of electrode rod 130 is set to be "four" and the four pad bonding patterns 34ep are arranged.

The ceramic wiring board 30 is not limited to a DBC substrate, and, for example, a DBA (Direct Bonded Aluminum) substrate, an AMB (Active Metal Bonding) substrate, and the like are also applicable.

Figure 5:
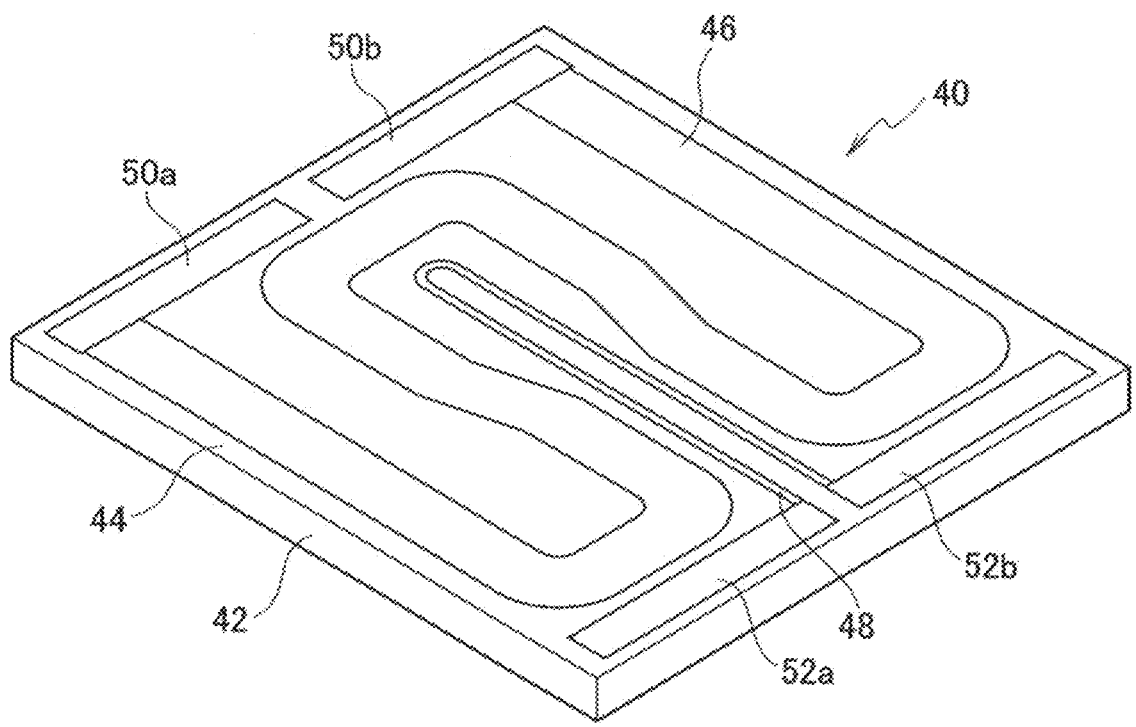
FIG. 5 is a perspective view schematically illustrating a pseudo beat generating chip that is a substrate evaluation chip according to the embodiment.

On the other hand, in the evaluation sample 20, as illustrated in FIG. 5 for example, the pseudo heat generating chip 40 includes a heating pattern (heater pattern) 46 and a temperature measurement pattern (probe pattern) 48 that are formed flat on a surface of an insulating substrate 42 by a metallic film such as a platinum thin film. Each of the electrode portions 50a, 50b of the heating pattern 46 and each of the electrode portions 52a, 52b of the temperature measurement pattern 48 are provided on the surface of the insulating substrate 42.

The insulating substrate 42 can cause a substantially all heat quantity by heat generation to be efficiently conducted to the ceramic wiring board 30 by having a thermal conductivity of 250 [W/mK] or more and by having a thermal conductivity of preferably about 400 [W/mK].

As the insulating substrate 42, although an SiC-based intrinsic semiconductor (high quality wafer) is desirable, an n-doped SiC-based single crystal substrate (for example, n-doped 4H SiC wafer) is also adoptable. By forming an insulating film (for example, $Al_2O_3$ film) 44 on a surface portion of the SiC-based single crystal substrate, ensuring of withstand voltage on the insulating substrate 42 is possible.

Figure 6A:
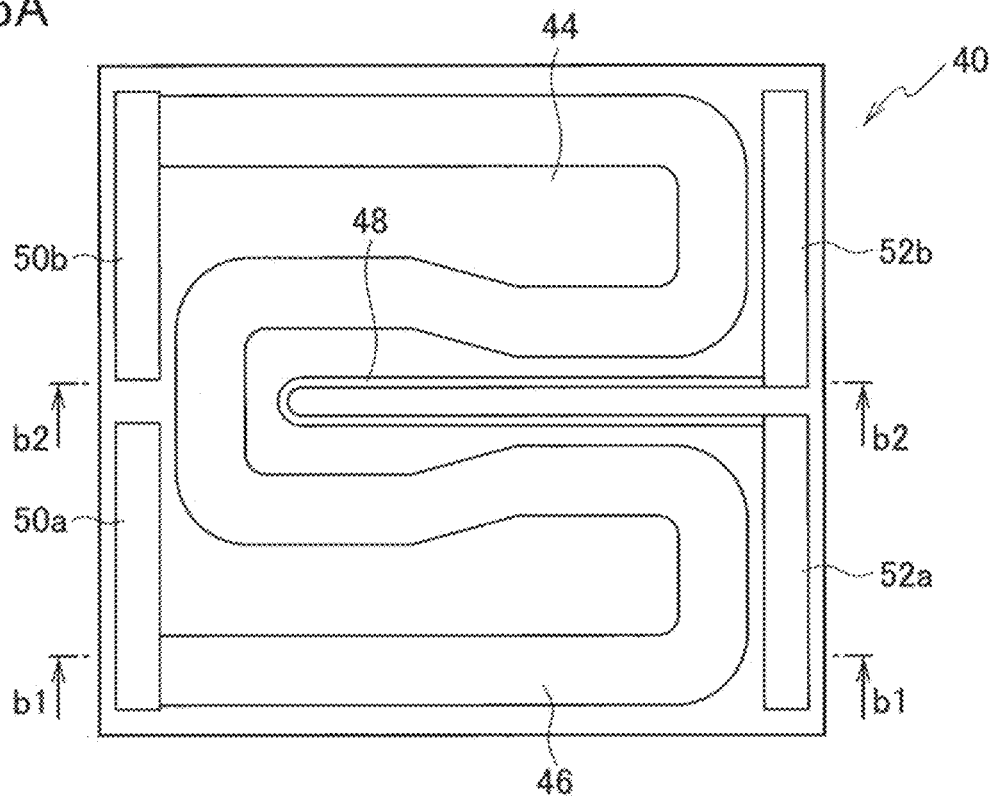
FIG. 6A is a schematic plan view of the pseudo heat generating chip illustrated in FIG. 5.
Figure 6B:
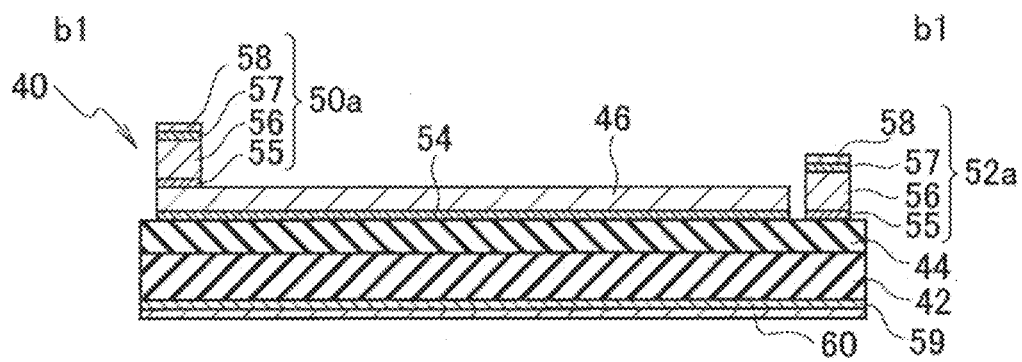
FIG. 6B is a schematic cross sectional view taken along a line b1-b1 of FIG. 6A.
Figure 6C:
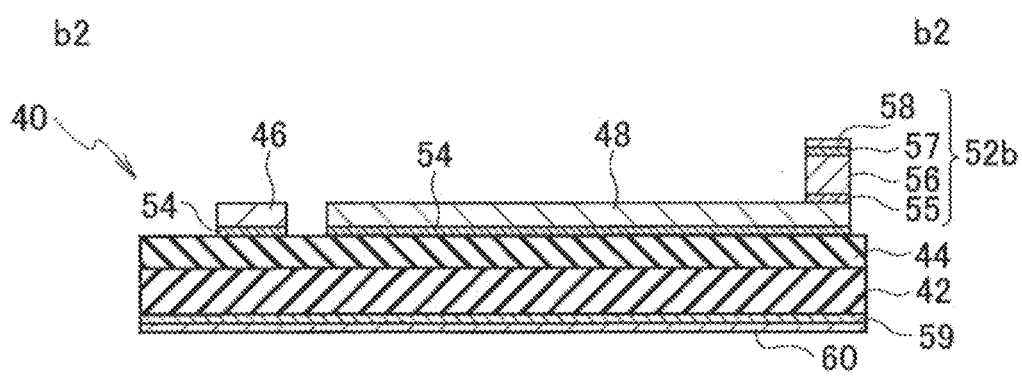
FIG. 6C is a schematic cross sectional view taken along a line b2-b2 of FIG. 6A.

That is, as illustrated in FIGS. 6A to 6C, the pseudo heat generating chip according to the embodiment includes the insulating substrate 42 formed from the n-doped SiC-based single crystal substrate, the $Al_2O_3$ film 44 having a thickness of about 5 [μm] formed on the surface of the insulating substrate 42, the heating pattern 46 and the temperature measurement pattern 48 formed by a platinum thin film having a thickness of about 200 [nm] formed on the surface of the $Al_2O_3$ film 44 via a titanium film 54 having a thickness of about 30 [nm], the electrode portions 50a, 50b formed to both end portions of the heating pattern 46, and the electrode portions 52a, 52b formed to both end portions of the temperature measurement pattern 48. A resistance value of a titanium/platinum thin film resistor of the heating pattern 46 is set to be less than 40[Ω] (<40[Ω]), and a resistance value of a titanium/platinum thin film resistor of the temperature measurement pattern 48 is set to be about 50 to 80[Ω].

Each of the electrode portions 50a, 50b of the heating pattern 46 and each of the electrode portions 52a, 52b of the temperature measurement pattern 48 include the copper film 56 having a thickness of 1 [μm] or more that is formed via the chromium film 55 having a thickness of about 30 [nm], and the gold film 58 having a thickness of about 200 [nm] that is formed on the copper film 56 via the chromium film 57 having a thickness of about 30 [nm]. This enables reducing a resistance and also suppressing oxidation under a high temperature.

The pseudo heat generating chip 40 has, on its rear surface side, the silver film 60 having a thickness of about 2 [μm] that is formed below the insulating substrate 42 via a titanium film 59 having a thickness of about 30 [μm].

Figure 7A:
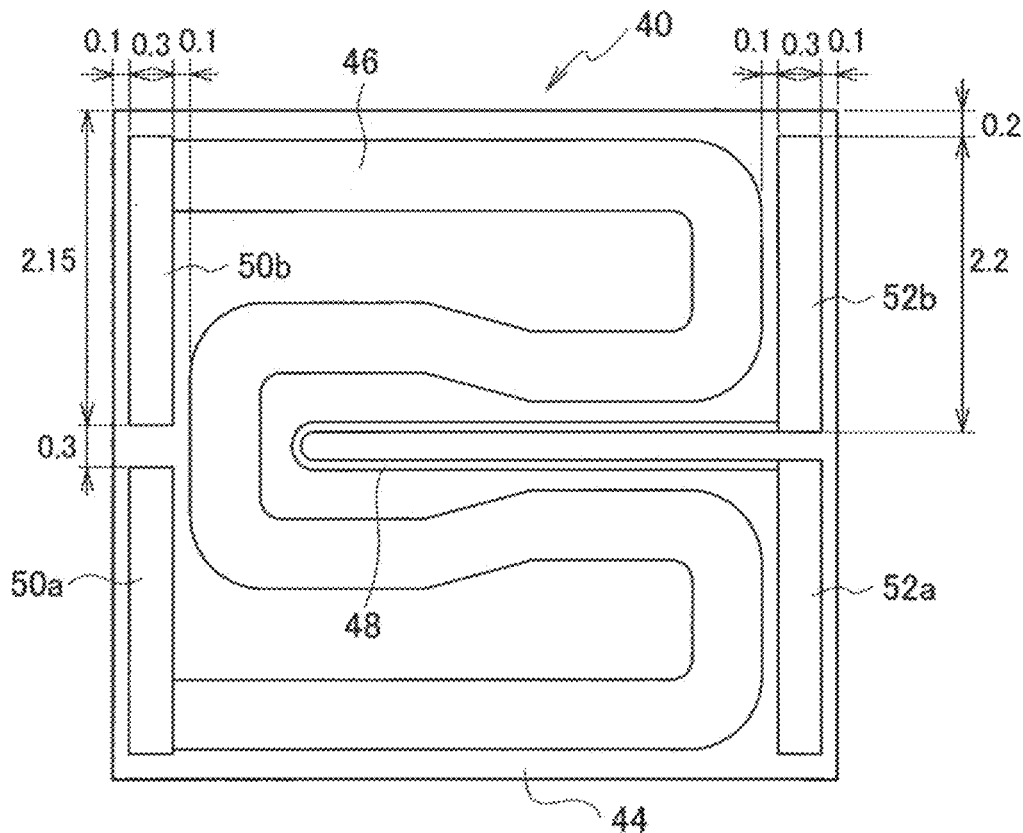
Figure 7B:
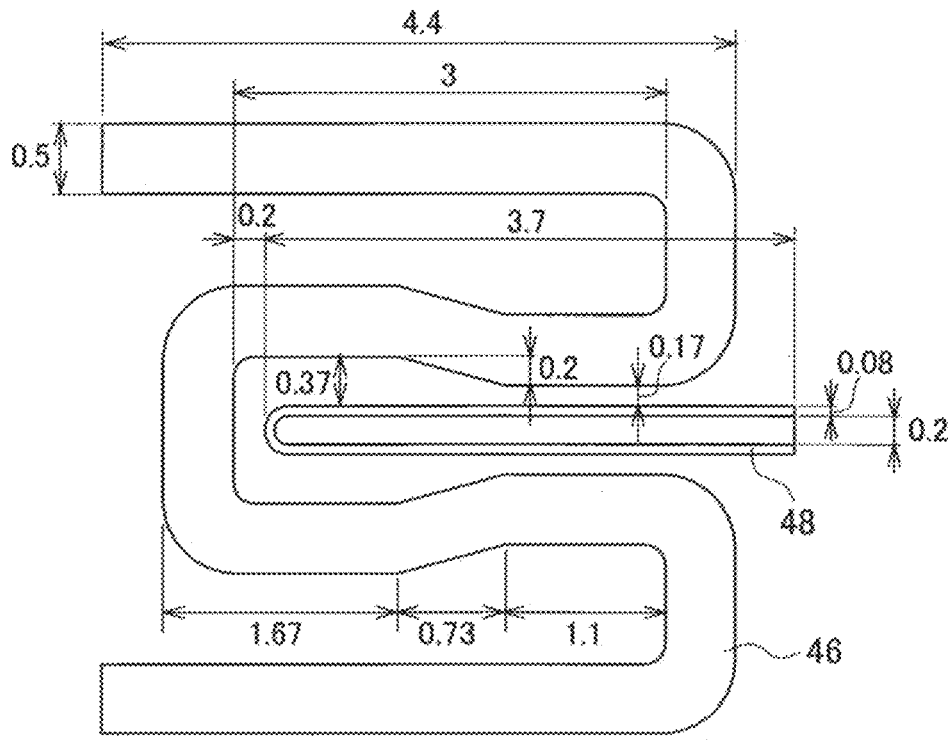

As illustrated in FIGS. 7A and 7B, the heating pattern 46 is formed by having predetermined shapes and sizes that are optimized from the viewpoint of a thermal resistance measurement so as to enable heating the insulating substrate 42 as uniformly as possible.

That is, in the pseudo heat generating chip 40 according to the embodiment, a size of the heating pattern 46, a curvature of a bent part and the like are designed so as to realize as possible as uniform and high-precision heat generation by the steady power Q supplied to the heating pattern 46 being controlled with high precision.

Particularly, in the mass production of the evaluation sample 20, it is important for reproducibility of thermal characteristics to make film forming conditions of the pseudo heat generating chip 40 uniform.

On the other hand, the temperature measurement pattern 48 having sizes and shapes as illustrated in FIGS. 7A and 7B is arranged in the vicinity of the center of the pseudo heat generating chip 40, and can measure a representative surface temperature of the pseudo heat generating chip 40 involved with heat generation of the heating pattern 46 more precisely. By the temperature measurement pattern 48 being able to precisely measure the representative surface temperature of the pseudo heat generating chip 40, a rise temperature $\Delta T$ (a temperature difference) of the insulating substrate 42 can be measured with high precision although the measurement is in the indirect way.

Further, the temperature of the insulating substrate 42 is conducted to the ceramic wiring board 30 to raise the temperature of the ceramic wiring board 30. Accordingly, by enabling the high-precision measurement of the rise temperature $\Delta T$ of the insulating substrate 42, from a heat quantity conducted from the pseudo heat generating chip 40 to the ceramic wiring board 30 by heat generation in a quantitative way and the rise temperature $\Delta T$, thermal resistance characteristics of the ceramic wiring board 30 (steady thermal resistance value $Rth=\Delta T/Q$) can be evaluated with high precision although it is in the pseudo way.

Note that, a unit of each size in FIGS. 7A and 7B is [mm].

Here, with respect to the heating pattern 46, results obtained by simulating temperature distribution and heat measurement based on a finite element method (FEM) are described. For example, by assuming that a thermal resistance of the ceramic wiring board 30 is 0.615 [K/W], the pseudo heat generating chip 40 was energized with 100 [W], and then, a maximum temperature in the heating pattern 46 was 110[° C.] and an average temperature in the temperature measurement pattern 48 was roughly 87[° C.]. From the average temperature of the temperature measurement pattern 48, it was lead that the thermal resistance of the ceramic wiring board 30 was 0.67 [K/W] and a value close to the assumed resistance value was obtained.

In the embodiment, the silver film 60 on the rear surface side of the pseudo heat generating chip 40 is bonded with the chip bonding pattern 34*dp* of the surface side electrode pattern 34 of the ceramic wiring board 30 via the bonding silver paste 22. Further, the gold film 58 of each of the electrode portions 50*a*, 50*b*, 52*a*, 52*b* is connected to the pad bonding pattern 34*ep* of any of the surface side electrode patterns 34 of the ceramic wiring board 30 via the gold wire BW. In this way, the evaluation sample 20 is constituted in which the pseudo heat generating chip 40 is mounted on the surface of the ceramic wiring board 30.

The two electrode rods 130 connected to the heating power supply 14 are respectively connected to the pad bonding patterns 34*ep*. 34*ep* that are connected with the respective electrode portions 50*a*, 50*b* of the heating pattern 46. Further, the two electrode rods 130 connected to the temperature measuring sensor 16 are respectively connected to the pad bonding patterns 34*ep*, 34*ep* that are connected with the respective electrode portions 52*a*, 52*b* of the temperature measurement pattern 48.

During a test, the evaluation sample 20 is arranged on an upper surface of the heat sink 100 via the heat radiating grease 24, but since thermal resistance characteristics depend on an interfacial thermal resistance (Rth) between the evaluation sample 20 and the heat sink 100, depending on application states of the heat radiating grease 24, some of them may cause a variation in the thermal resistance characteristics.

Therefore, by applying an appropriate load (about 70 [N] at maximum) to the evaluation sample 20 with, for example, the four electrode rods 130, the interfacial thermal resistance (Rth) between the beat sink 100 and the evaluation sample 20 becomes more stable.

That is, the interfacial thermal resistance (Rth) is affected by the magnitude of a load at the time of pressing the evaluation sample 20 against the heat sink 100.

Therefore, in the evaluation sample 20 according to the embodiment, an experiment (pre-test) is performed, the steady power Q is fixed to 127 [W] for example, and a load is cyclically changed in a range from 5 [N] to 30 [N], then, the experiment reveals that the interfacial thermal resistance (Rth) with the heat sink 100 is most stable (about 0.61 to 0.63 [K/W]) when the load is set to be 25 to 30 [N].

Further, by repeating the experiment, the experiment reveals that there is a cycle dependency between the load and the thermal resistance and the thermal resistance becomes more stable when the load is reduced than when the load is increased.

On the other hand, in an experiment, if a load is set to be constant (for example, 30 [N]) while the steady power Q is caused to be changed, the interfacial thermal resistance (Rth) between the evaluation sample 20 and the heat sink 100 shows a tendency to converge in connection with the increase in the steady power Q.

Further, by repeating the experiment, the experiment reveals that the cycle dependency is present between the steady power and the thermal resistance.

Further, in the evaluation sample 20 in a steady state in which a load (for example, 30 [N]) and a voltage value of the steady power Q (for example, 80 [V]) are constant, by repeating the experiment, it is estimated that a measured temperature of the temperature measuring sensor 16 (for example, T_Pt [° C.] has a critical effect on the interfacial thermal resistance (Rth) with the heat sink 100.

From the above, it is estimate that as the load is large, an influence of the interfacial thermal resistance by the heat radiating grease 24 become smaller and the precision of the test becomes higher.

In the embodiment, the more high-precision evaluation can be realized by enabling temperature characteristics of the temperature measurement pattern 48 of the pseudo heat generating chip 40 to be corrected in accordance with a temperature at the time of evaluation, for example.

(Characteristics of Pseudo Heat Generating Chip)

Here, characteristics of the pseudo heat generating chip 40 in the evaluation sample 20 according to the embodiment are described.

Figure 8:
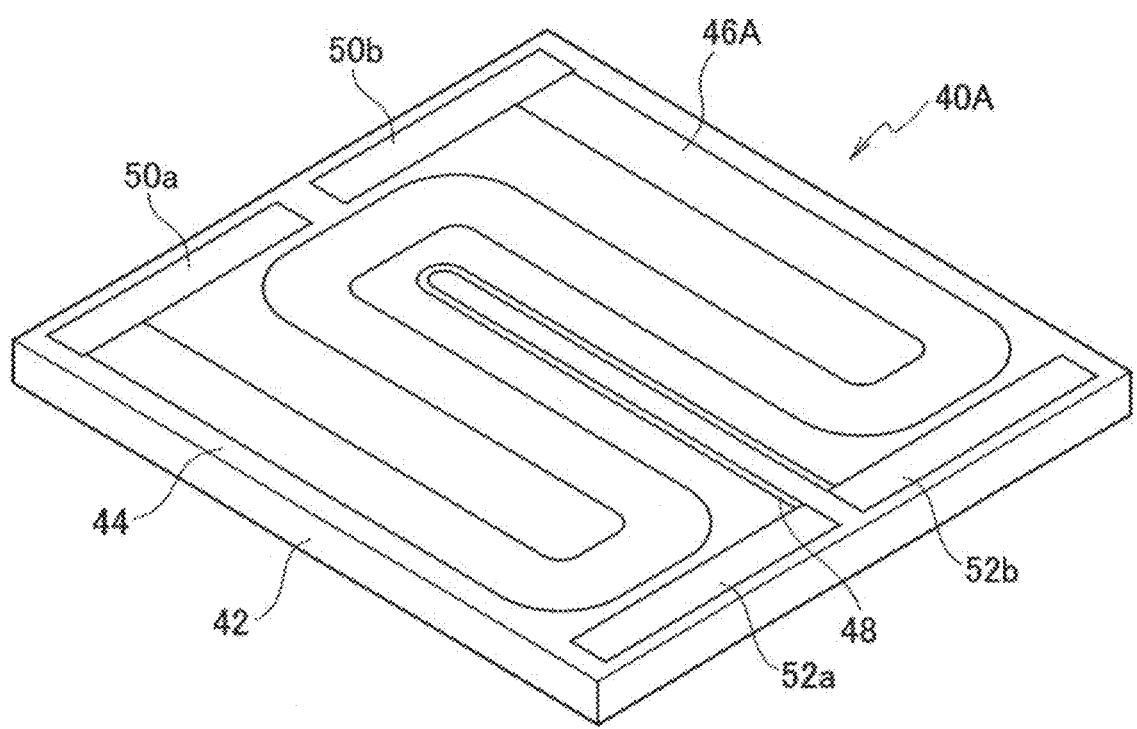
FIG. 8 is a perspective view schematically illustrating a constitution of a comparative pseudo heat generating chip.

FIG. 8 is a schematic perspective view illustrating an example of a constitution of a comparative pseudo heat generating chip 40A for comparison with the evaluation sample 20 according to the embodiment.

The comparative pseudo heat generating chip 40A illustrated in FIG. 8 is the same as the pseudo heat generating chip 40 according to the embodiment illustrated in FIG. 5 for example, excepts that a shape of the heating pattern 46A in FIG. 8 is different from a shape of the heating pattern 46 illustrated in FIG. 5, and thus, detailed descriptions thereof are omitted.

That is, while, in the pseudo heat generating chip 40 according to the embodiment, the heating pattern 46 is formed by having a predetermined shape that enables heating the insulating substrate 42 as uniformly as possible, the comparative pseudo heat generating chip 40A is slightly inferior in that respect.

Figure 9A:
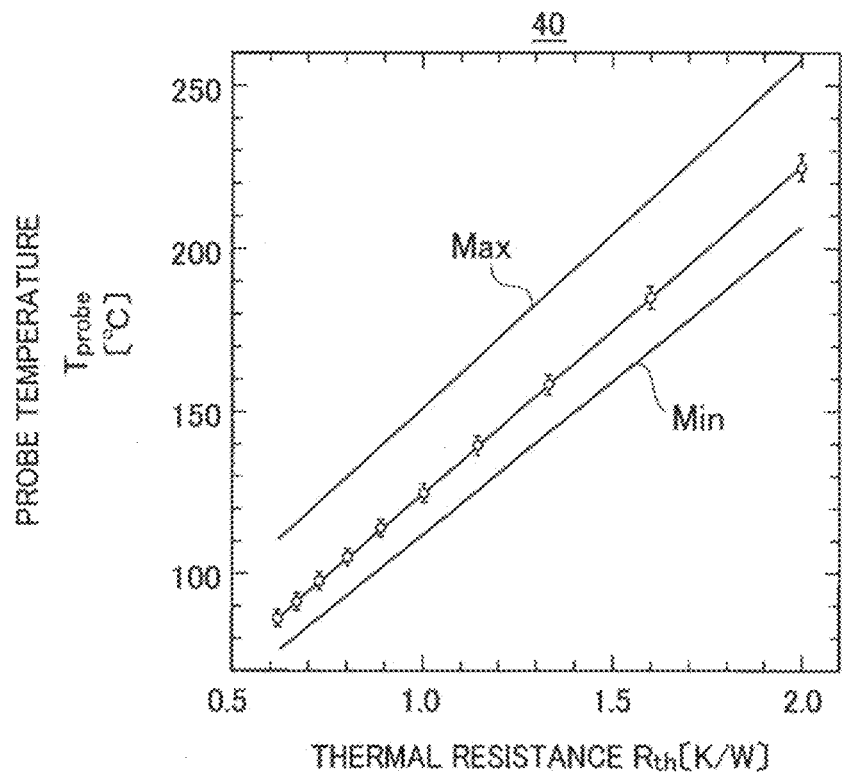
FIG. 9A is s a graph showing a simulation result of a relation between a thermal resistance and a probe temperature in the pseudo heat generating chip according to the embodiment.
Figure 9B:
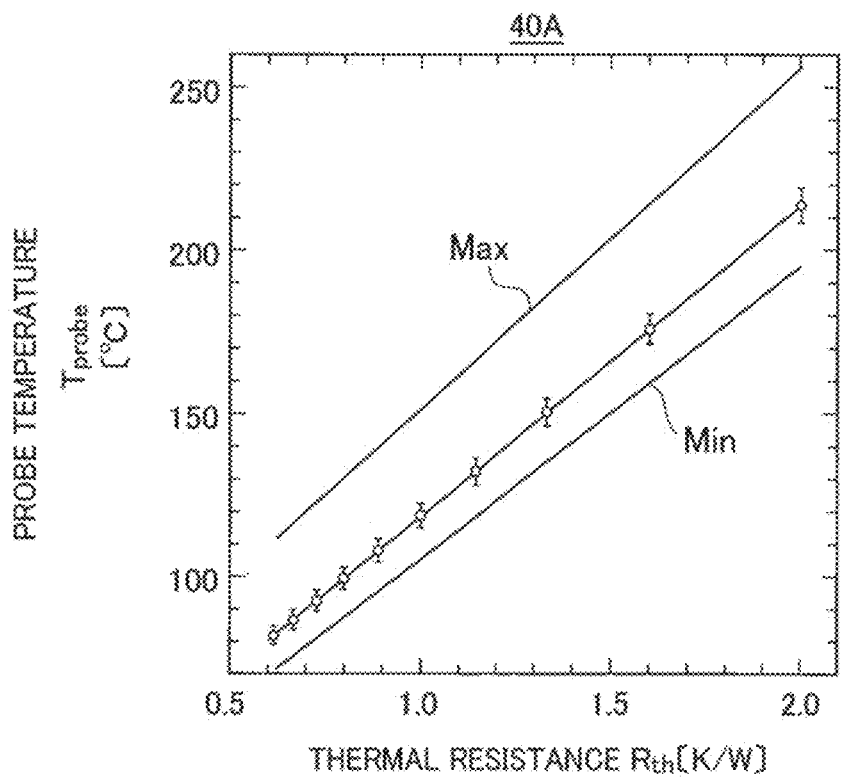
FIG. 9B is a graph showing a simulation result of a relation between a thermal resistance and a probe temperature in the comparative pseudo heat generating chip 40A.

FIG. 9A is a graph illustrating a simulation result of a relationship between a thermal resistance Rth [K/W] and a probe temperature [° C.] in the pseudo heat generating chip 40 according to the embodiment and FIG. 9B is a graph illustrating a simulation result of a relationship between a thermal resistance Rth [K/W] and a probe temperature [° C.] in the comparative pseudo heat generating chip 40A.

As can be seen from FIGS. 9A and 9B, the pseudo heat generating chip 40 according to the embodiment can more improve temperature distribution than the comparative pseudo heat generating chip 40A.

Figure 10:
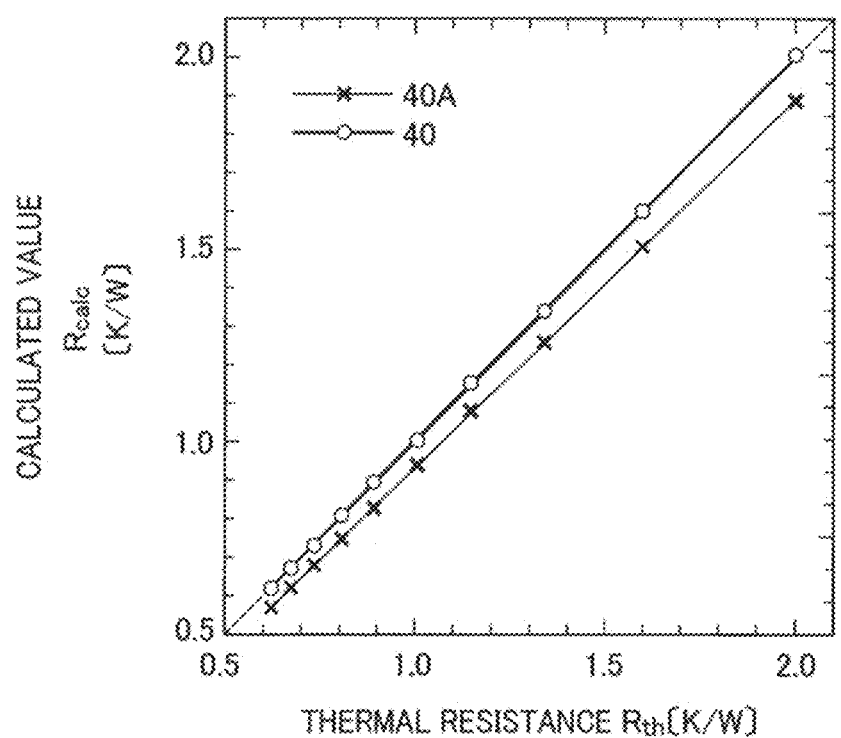
FIG. 10 is a graph showing a relationship between a thermal resistance and a thermal resistance obtained by calculation (a calculated value) with respect of a characteristic of the pseudo heat generating chip according to the embodiment and a characteristic of the pseudo heat generating chip of the comparative example.

FIG. 10 is a graph illustrating a relationship between the thermal resistance Rth [K/W] and a thermal resistance obtained by calculation (a calculated value) Rcalc [K/W] in contrast as results obtained by simulating characteristics of the pseudo heat generating chip 40 according to the embodiment and the comparative pseudo beat generating chip 40A.

As can be seen from FIG. 10 also, the pseudo heat generating chip 40 according to the embodiment can reproduce a preset sample thermal resistance (indicated with a short dashed line in the drawing) more faithfully than the comparative pseudo heat generating chip 40A.

That is, with respect to the heating pattern 46 of the pseudo heat generating chip 40 according to the embodiment and the heating pattern 46A of the comparative pseudo heat generating chip 40A, temperature distribution and heat measurement were simulated based on the above described finite element method (FEM), the heating pattern 46 of the pseudo heat generating chip 40 according to the embodiment and the heating pattern 46A of the comparative pseudo heat generating chip 40A were energized with 100 [W], and the thermal resistance of the ceramic wiring board 30 was changed in a range from 0.6[K/W] to 2.0 [K/W], then, it was revealed that the pseudo heat generating chip 40 according to the embodiment was more approximate to an original thermal resistance of the ceramic wiring board 30.

Various shapes of designs are considered for a heating pattern of a pseudo heat generating chip. FIG. 11 exemplifies, for example, a fin-attached heating pattern 46B in which a plurality of fins 47 are attached to the heating pattern 46A of the comparative pseudo heat generating chip 40A. With the plurality of fins 47, a more uniform diffusion of heat in the pseudo heat generating chip can be expected.

FIGS. 12A and 12B illustrate a case where the heating pattern 46 of the pseudo heat generating chip 40 according to the embodiment (see FIG. 7B and the like) is heated uniformly and a case where the fin-attached heating pattern 46B of FIG. 11 is heated uniformly (for example, the steady power Q=200 [W] respectively in contrast. FIG. 12A illustrates temperature distribution of an upper surface side and a lower surface side of the pseudo heat generating chip 40 arranged with the heating pattern 46 according to the embodiment. FIG. 12B illustrates temperature distribution of an upper surface side and a lower surface side of the pseudo heat generating chip arranged with the fin-attached heating pattern 46B of FIG. 11.

As can be seen from FIG. 12B also, the fin-attached heating pattern 46B attached with the plurality of fins 47 can heat the pseudo heat generating chip more entirely and particularly, can heat the upper surface side more uniformly than the heating pattern 46 without fins according to the embodiment.

Here, the heating pattern 46 according to the embodiment may be modified to a fin-attached heating pattern attached with the plurality of fins 47.

(Test for Evaluation)

Form the above, by the substrate evaluation device 1 performing a test for evaluating thermal characteristics of the ceramic wiring board 30 by using the evaluation sample 20 mounted with the pseudo heat generating chip 40 according to the embodiment, it becomes possible to evaluate steady thermal resistance characteristics of the ceramic wiring board 30 with high precision.

That is, in the substrate evaluation device 1 according to the embodiment, first the evaluation sample 20 is arranged on the surface of the heat sink 100, and then, the operation handle 154 is operated by an operator. During an operation, the operator adjusts a load sensed by the load sensor element 18a while monitoring the load sensor indicator 18 so that a predetermined load (for example, 30 [N]) is applied to the supporting rigid body 140. In accordance with the load, the electrode rod 130 presses the evaluation sample 20 against the heat sink 100 whose temperature is controlled to be the predetermined temperature (for example, 25 [° C.].

In this state, the heating power supply 14 energizes the evaluation sample with the steady power for heating Q (for example, about 200 [W]) via the two electrode rods 130 connected thereto. In accordance with the energization with the steady power Q, for example, by the pseudo heat generating chip 40 of the evaluation sample 20 being heated with Joule heat, the insulating substrate 42 is heated in association with the heat generation of the heating pattern 46.

After an elapse of a predetermined time from the start of the energization and after a state is shifted to a steady state, a surface temperature of the pseudo heat generating chip 40 in the evaluation sample 20 is measured by the temperature measuring sensor 16 via the temperature measurement pattern 48 and the two electrode rods 130 connected to the temperature measuring sensor 16. This enables an indirect measurement of the rise temperature $\Delta T$ of the insulating substrate 42.

Here, if it is assumed that a temperature gradient (rise temperature) of the ceramic wiring board 30 in the steady state in a thickness direction becomes $\Delta T$ [° C.], the thermal resistance Rth [K/W] of the ceramic wiring board 30 is obtained by Formula (1) below.

$$R\text{th} = \Delta T/Q \qquad (1)$$

Here, Q is a heat generation amount of the pseudo heat generating chip 40, in other words, Q is steady power [W] during the energization.

From the above, by the rise temperature $\Delta T$ of the insulating substrate 42 being measured, the steady thermal resistance value Rth of the ceramic wiring board is obtained from the rise temperature $\Delta T$ and the steady power Q.

By making an arrangement such that the steady thermal resistance value Rth is automatically calculated by, for example, a computer (not illustrated) for controlling the substrate evaluation device 1, a pseudo-evaluation of the thermal characteristics of the ceramic wiring board 30 in a state substantially the same as when an actual power module is actually driven becomes possible. As a result, the high-precision evaluation of the thermal characteristics of the ceramic wiring board 30 and establishment of a standard method thereof can be easily realized.

In accordance with the evaluation sample 20 and the substrate evaluation device 1 according to the embodiment, the evaluation sample 20 is caused to generate heat as uniformly as possible and at the same time, a representative temperature of a surface of the pseudo heat generating chip 40 is measured, and accordingly it becomes possible to measure the rise temperature of the ceramic wiring board 30 more precisely. Accordingly, steady thermal resistance characteristics of the ceramic wiring board 30 can be evaluated with high precision and standardization of the evaluation becomes possible easily.

Particularly, sine in the embodiment, a load is applied to the evaluation sample 20 via the electrode rods 130 for power supply and resistance measurement, with a simple constitution, a test for evaluation can be performed with high precision.

Moreover, electrical and thermal contact between the contact portion 132 of each electrode rod 130 and each pad bonding pattern 34ep is set to have a minimum area. This can prevent the precision of the temperature measurement from being lowered and can improve the precision of evaluation.

Further, according to the embodiment, a load at the time of pressing the evaluation sample 20 can be sensed precisely, and thus, an interfacial thermal resistance Rth between the heat sink 100 and the ceramic wiring board 30 can be controlled with high precision.

In accordance with the evaluation sample 20 and the substrate evaluation device 1 according to the embodiment, it is not limited to a steady thermal resistance characteristic, but it can be also applied to a test for heat radiation characteristics, thermal shock characteristics, and the like of the ceramic wiring board 30, for example.

Note that, if a measurement of a surface temperature of the pseudo heat generating chip 40 by the temperature measurement pattern 48 is not necessary, from the constitution of the pseudo heat generating chip 40, the temperature measurement pattern 48 and the electrode portions 52a and 52b formed to both end portions of the temperature measurement pattern 48 may be omitted.

Further, to avoid receiving an influence of convection, a cover member (not illustrated) may surround the periphery thereof.

Although the present invention has been described with reference to the embodiment as above, the embodiment is merely an example, and a scope of the invention described in the claims can be variously modified without departing from a gist of the invention.

What is claimed is:

1. A substrate evaluation chip used to perform a test for evaluating a thermal characteristic of a mounting substrate on which a power semiconductor is mountable, the substrate evaluation chip comprising:
   an insulating substrate bonded with the mounting substrate; and
   a heating pattern that is formed on a surface of the insulating substrate by a metallic film and is arranged by having a predetermined shape that is optimized to heat the insulating substrate more uniformly, wherein
   the insulating substrate is a substrate in which an insulating film is formed on a surface of a single crystal substrate having a thermal conductivity of 250 W/mK or more.

2. The substrate evaluation chip according to claim 1, further comprising:
   a temperature measurement pattern that is formed on the surface of the insulating substrate by a metallic film and is configured to measure a temperature of the insulating substrate heated by the heating pattern.

3. The substrate evaluation chip according to claim 1, wherein
   the insulating substrate is a substrate in which the insulating film is formed on a surface of an SiC-based single crystal substrate.

4. The substrate evaluation chip according to claim 1, wherein
   the mounting substrate is a ceramic wiring board.

5. A substrate evaluation device used to perform a test for evaluating a thermal characteristic of a mounting substrate on which a power semiconductor is mountable in a state in which a substrate evaluation chip is mounted on a surface of the mounting substrate, the substrate evaluation device comprising:
   the substrate evaluation chip comprising an insulating substrate bonded with the mounting substrate, a heating pattern that is formed on a surface of the insulating substrate by a metallic film and is arranged by having a predetermined shape that is optimized to heat the insulating substrate more uniformly, a temperature measurement pattern that is formed on the surface of the insulating substrate by a metallic film and is configured to measure a temperature of the insulating substrate heated by the heating pattern, a first electrode pad connected to one end of the heating pattern on the surface of the insulating substrate and formed by a metallic film, a second electrode pad connected to another end of the heating pattern on the surface of the insulating substrate and formed by a metallic film, a third electrode pad connected to one end of the temperature measurement pattern on the surface of the insulating substrate and formed by a metallic film, and a fourth electrode pad connected to another end of the temperature measurement pattern on the surface of the insulating substrate and formed by a metallic film;
   the mounting substrate comprising a chip bonding pattern bonded with the substrate evaluation chip and a plurality of pad bonding patterns respectively connected with one of the first electrode pad, the second electrode pad, the third electrode pad, and the fourth electrode pad;
   a cooling unit configured to cool the mounting substrate;
   a load application unit comprising a plurality of terminal electrodes for pressing the mounting substrate against the cooling unit via the plurality of pad bonding patterns;
   a heating unit configured to raise a temperature of the insulating substrate of the substrate evaluation chip by heating the heating pattern of the substrate evaluation chip via any terminal electrodes of the plurality of terminal electrodes; and
   a measuring unit configured to measure the temperature of the insulating substrate by the temperature measurement pattern of the substrate evaluation chip via any terminal electrodes of the plurality of terminal electrodes, wherein
   the thermal characteristic of the mounting substrate is evaluated based on a measurement result of the measuring unit.

6. The substrate evaluation device according to claim 5, wherein
   each of the plurality of terminal electrodes comprises a contact portion that contacts with respective pad bonding patterns of the mounting substrate, and the contact portion has a hemispherical shape.

7. The substrate evaluation device according to claim 5, wherein
   the plurality of terminal electrodes are commonly supported by an insulating support member; and
   the insulating support member comprises a load detection unit configured to detect a load at a time of pressing the mounting substrate against the cooling unit, the load being applied by the load application unit.

8. The substrate evaluation device according to claim 5, wherein
   the insulating substrate is a substrate in which an insulating film is formed on a surface of a single crystal substrate having a thermal conductivity of 250 W/mK or more.

9. The substrate evaluation device according to claim 5, wherein
   the insulating substrate is a substrate in which an insulating film is formed on a surface of an SiC-based single crystal substrate.

* * * * *